United States Patent
Yin et al.

(10) Patent No.: US 9,468,111 B2
(45) Date of Patent: Oct. 11, 2016

(54) HOUSING ASSEMBLY AND SOLID STATE DRIVE HAVING THE SAME

(71) Applicant: UNIVERSAL SCIENTIFIC INDUSTRIAL (SHANGHAI) CO., LTD., Shanghai (CN)

(72) Inventors: Chun-Chi Yin, Caotun Township, Nantou County (TW); Dao-Wei Fan, Caotun Township, Nantou County (TW)

(73) Assignee: UNIVERSAL SCIENTIFIC INDUSTRIAL (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 14/689,556

(22) Filed: Apr. 17, 2015

(65) Prior Publication Data

US 2016/0212863 A1    Jul. 21, 2016

(30) Foreign Application Priority Data

Jan. 20, 2015  (CN) .......................... 2015 2 0036783

(51) Int. Cl.
*H05K 5/02* (2006.01)
*H05K 5/00* (2006.01)

(52) U.S. Cl.
CPC ............ *H05K 5/006* (2013.01); *H05K 5/0004* (2013.01); *H05K 5/0217* (2013.01); *H05K 5/0221* (2013.01)

(58) Field of Classification Search
None
See application file for complete search history.

(56) References Cited

U.S. PATENT DOCUMENTS

| | | | | |
|---|---|---|---|---|
| 4,912,602 A * | 3/1990 | Zurek | .................. | H04B 1/3833 361/752 |
| 5,038,250 A * | 8/1991 | Uenaka | ................ | G06K 19/077 235/492 |
| 5,278,351 A * | 1/1994 | Herrick | ............... | H05K 9/0049 174/372 |
| 5,383,098 A * | 1/1995 | Ma | ...................... | H04B 1/3833 174/371 |
| 5,548,483 A * | 8/1996 | Feldman | .............. | H05K 5/0269 235/88 R |
| 6,075,709 A * | 6/2000 | Yang | .................... | H05K 5/0282 361/736 |
| 6,808,239 B1 * | 10/2004 | Bader | ................. | H04M 1/0252 292/19 |
| 6,992,901 B1 * | 1/2006 | Hung | ................... | H05K 9/0009 174/385 |
| 7,916,500 B2 * | 3/2011 | Shi | ....................... | H05K 5/0013 174/350 |
| 8,243,456 B2 * | 8/2012 | Tochi | ................... | G06K 7/0047 156/73.1 |
| 8,422,220 B2 * | 4/2013 | Chen | ...................... | E05C 19/06 361/679.58 |
| 8,531,845 B2 * | 9/2013 | Chen | ................... | H05K 5/0208 361/752 |
| 8,831,538 B2 * | 9/2014 | Yuen | ...................... | A61B 5/222 455/556.1 |
| 2004/0174665 A1 * | 9/2004 | Mockridge | ......... | H04M 1/0249 455/347 |
| 2005/0185365 A1 * | 8/2005 | Yamaguchi | ........... | G06F 1/1601 361/679.21 |
| 2007/0052100 A1 * | 3/2007 | Bellinger | ................. | H01R 4/48 257/758 |
| 2007/0293282 A1 * | 12/2007 | Lewis | ................. | H04M 1/0252 455/575.1 |
| 2008/0146293 A1 * | 6/2008 | Kim | .................... | H04M 1/0252 455/575.1 |

(Continued)

*Primary Examiner* — Courtney Smith
*Assistant Examiner* — Rashen E Morrison
(74) *Attorney, Agent, or Firm* — Muncy, Geissler, Olds & Lowe, P.C.

(57) ABSTRACT

A housing assembly, including a top housing, a bottom housing and an accommodation, is provided. The top housing has a top plate, and a first sidewall extending therefrom. The bottom housing has a bottom plate, and a second sidewall extending therefrom. The engagement slit is defined by an upper edge and a lower edge in order to mate with a printed circuit board. The second sidewall includes an inclination wall extending from the lower edge of the engagement slit and distancing from the accommodation outwardly and downwardly, and an slot being adjacent to the inclination wall. The first sidewall includes a fringe protrusion, which slides along the inclination wall of the second sidewall to engage with a distal end of the inclination wall, and the top housing connects to the bottom housing thereby. The housing assembly is advantageous of easy and convenient assembly and disassembly.

9 Claims, 3 Drawing Sheets

(56) References Cited

U.S. PATENT DOCUMENTS

| | | | | |
|---|---|---|---|---|
| 2009/0059485 A1* | 3/2009 | Lynch | H01H 9/0207 | 361/679.01 |
| 2009/0247237 A1* | 10/2009 | Mittleman | H04M 1/026 | 455/567 |
| 2009/0257207 A1* | 10/2009 | Wang | G06F 1/1626 | 361/752 |
| 2011/0228458 A1* | 9/2011 | Richardson | H04M 1/0252 | 361/679.01 |
| 2012/0044435 A1* | 2/2012 | Dai | G06F 1/1656 | 349/58 |
| 2012/0044436 A1* | 2/2012 | Chiang | G06F 1/1656 | 349/58 |
| 2012/0044437 A1* | 2/2012 | Dai | G06F 1/1637 | 349/58 |
| 2013/0242481 A1* | 9/2013 | Kim | H05K 5/06 | 361/679.01 |
| 2014/0146441 A1* | 5/2014 | Hautamaki | H04M 1/0262 | 361/679.01 |
| 2015/0014188 A1* | 1/2015 | Pyo | A45C 11/00 | 206/37 |
| 2016/0088760 A1* | 3/2016 | Yukito | G06F 1/20 | 361/679.48 |

* cited by examiner

HOUSING ASSEMBLY AND SOLID STATE DRIVE HAVING THE SAME

BACKGROUND OF THE INVENTION

1. Field of the Invention

The present invention relates generally to a storage media, and more particularly to a housing assembly and a solid state drive having the same.

2. Description of the Related Art

As speedy development of the computer industry, the peripherals of the computer evolve world wildly. For example, a solid state drive is advantaged of high-capacity storage, convenient carry, excellent reliability and so on, so that it becomes popular and wildly applicable in the market.

To meet the stability and durability of the solid state drive, it is to provides secure casing for the solid state drive in the current technology. Usually, an top housing and a bottom housing are provided to form the casing, each is preformed of a plurality of screw holes mating to with screw bolts and screws for connecting with together. In assembly, the top and bottom housings are secured to each other via the screws; on the contrary, the top housing is disengaged from the lower hosing by loosening screws with specific tools. Through the screw type connection, the casing of the solid state drive is guaranteed to keep secured and prevented from falling apart.

However, in the conventional connection, it causes inconvenient operation and hassle workload either in assembly or disassembly, and it is required further implementation of specific tools, which meets the screws. Obviously, the conventional screw type connection indeed is inconvenient in operation.

SUMMARY OF THE INVENTION

The objective of the present invention is to provide a housing assembly, which is advantageous of easy and convenient assembly and disassembly, with a hassle-free applicable to the solid state drive.

The foregoing objective of the present invention is attained by a housing assembly comprising a top housing, a bottom housing, and an accommodation defined by the top housing covered with the bottom housing. The top housing has a top plate, and a first sidewall extending from a periphery of the top plate and approaching the bottom housing. The bottom housing has a bottom plate, and a second sidewall extending from a periphery of the bottom plate and approaching the top housing. The second sidewall has at least one engagement slit for being mated with a printed circuit board, which is received in the accommodation.

In the housing assembly of the present invention, the engagement slit is defined by an upper edge and a lower edge. The second sidewall includes an inclination wall extending from the lower edge of the engagement slit and distancing from the accommodation outwardly and downwardly, and a slot being adjacent to the inclination wall.

The first sidewall includes a fringe protrusion approaching the accommodation and corresponding with the inclination wall. The fringe protrusion of the first sidewall keeps sliding along the inclination wall of the second sidewall so as to engage with a distal end of the inclination wall, while the top housing covers the bottom housing.

The slot exposes wholly or partially, after the top housing engages with the bottom housing.

In further preferable description, the second sidewall defines a concave portion against the accommodation, and the inclination wall is disposed at the concave portion.

In further preferable description, the slot sits to overlap with the concave portion.

In further preferable description, the slot is applicable with a lever member so that the lever member is capable of disengaging the top housing from the bottom housing.

In further preferable description, the bottom housing defines an indentation at a conjunction between the bottom plate and the second sidewall. The indentation corresponds to and sits below the inclination wall, and a top of the indentation overlies the distal edge of the inclination wall. The fringe protrusion of the first sidewall keeps sliding along the inclination wall of the second sidewall until it reaches in the indentation below the inclination wall, while the top housing covers the bottom housing.

The objective of the present invention is to provide a solid state drive comprising the housing assembly and the printed circuit board mentioned above. The printed circuit board defines a border, which mates to the engagement slit of the bottom housing, so that the printed circuit board is secured in the accommodation.

In further preferable description, the printed circuit board includes an electrical connector disposed at a front end thereof.

In further preferable description, the bottom plate of the bottom housing includes a receding portion disposed at a first end thereof, the top housing has an opening in correspondence with the receding portion of the bottom plate; the electrical connector exposes via the receding portion as the top housing engages with the bottom housing.

In further preferable description, the bottom plate of the bottom housing includes at least one support stage disposed at a second end thereof, wherein the second end is opposite to the first end. The support stage projects towards the top housing, so as to prop the printed circuit board for pre-position before the printed circuit board mates to the engagement slit.

In further preferable description, the second sidewall includes at least one restraint projection disposed at an interior face thereof, the restraint projection abuts against the border of the printed circuit board while the printed circuit board mates to the engagement slit.

The housing assembly and solid state drive according to the present invention is advantageous of at least features below:

1, The bottom housing is provided with the inclination wall, and the slot is further formed thereon to sit just next to the inclination wall. The top housing is provided with the fringe protrusion, which corresponds to the inclination wall of the bottom housing. When the top housing covers the bottom housing, the inclination wall of the bottom housing guides the fringe protrusion of the top housing to slide along the slop per se. Until the fringe protrusion of the top housing passes a distal edge of the inclination wall to reach the indentation, the fringe protrusion of the top housing thereby engages with the distal end of the inclination wall of the bottom housing. Beyond that, the slot provides a space that allows a lever member to enforce against for leveraging to disengage the top and the bottom housings apart.

2, The bottom plate of the bottom housing is provide with the support stage, which is used for propping the printed circuit board in advance before the printed circuit board fits in the engagement slit. The support stage further improves the structure strength of the bottom housing in order to diminish the possibility and amount of deformation, which is usually resulted by external impact, of the printed circuit board.

3, The bottom housing is provided with the engagement slit, which is capable of engaging the border of the printed circuit board, the printed circuit board is accordingly secured.

DETAILED DESCRIPTION OF PREFERRED EMBODIMENTS

For further description to these embodiments according to the present invention, there would be some presentation of drawings, which obviously illustrates but not constrains the embodiments.

In order to clearly illustrate embodiments according to the present invention, the following embodiments will need to be used to make a brief introduction by the accompanying drawings. It is obvious that the following description of the drawings is to illustrate but not to constrain the embodiments. For people skilled in the art, it's possible to obtain additional figures based on these drawings under the premises of paying no additional creative efforts.

Figure 1:
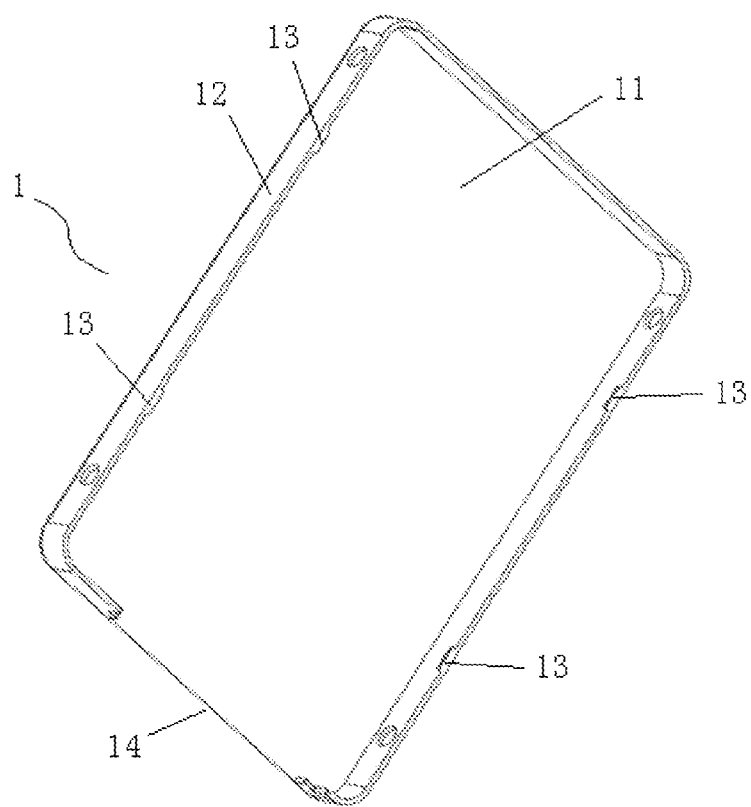
FIG. 1 is a perspective view of a top housing of a housing assembly according to the present invention.
Figure 2:
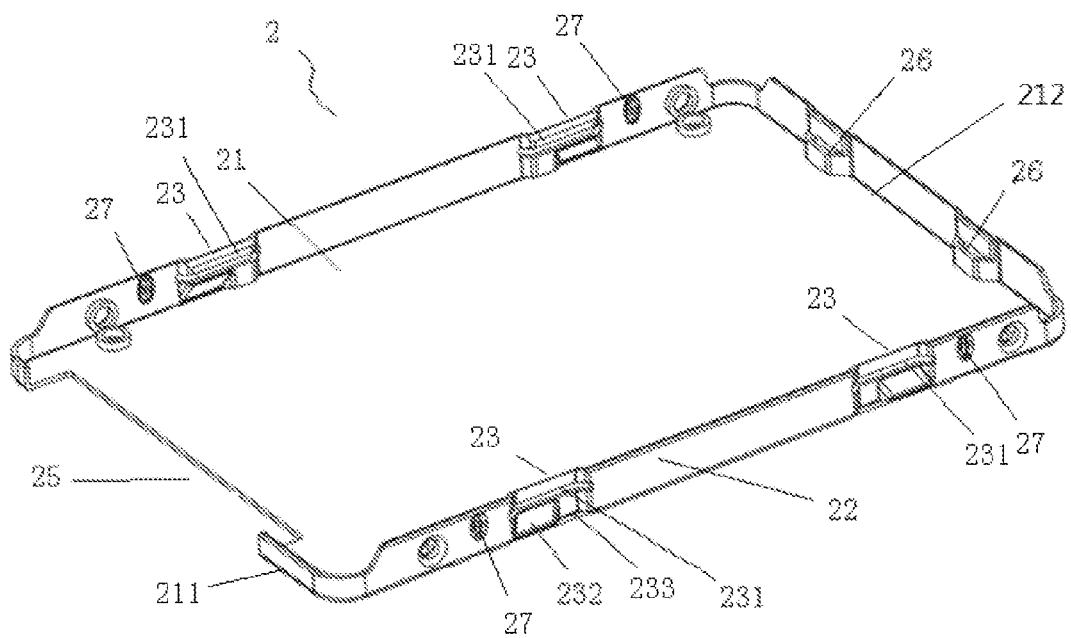
FIG. 2 is a perspective view of a bottom housing of the housing assembly according to the present invention.

Referring to FIG. 1, a perspective view of a top housing 1 of an embodiment of a housing assembly according to the present invention, and FIG. 2, a perspective view of a bottom housing 2 of the embodiment of the housing assembly according to the present invention, are provided. The housing assembly according to the embodiment includes the top housing 1 and the bottom housing 2, which both are made of sheet metal materials. An accommodation defined by the top housing 1 covered with the bottom housing 2, and the accommodation is for receiving a printed circuit board 3 therein.

Referring to FIG. 1, the top housing 1 includes a top plate 11 and a first sidewall 12. The first sidewall 12 extends from a periphery of the top plate 11 and approaches towards the bottom housing 2.

Referring to FIG. 2, the bottom housing 2 includes a bottom plate 21 and a second sidewall 22. The second sidewall 22 extends from a periphery of the bottom plate 21 and approaches towards the top housing 1. The second sidewall 22 includes at least one engagement slit 231 for being mated with the printed circuit board 3.

With further reference in FIG. 2, there are four engagement slits 231 in order to mate with the printed circuit board 3. The four engagement slits 231 are distributed along the lateral parts of the second sidewall 22, and each is created at an mid-upper section on the second sidewall 22; wherein the lateral parts of the second sidewall 22 sets along the longitudinal length of the bottom plate 21. The quantity and arrangement of the engagement slit 231 obviously is free from description of the embodiment.

Figure 3:
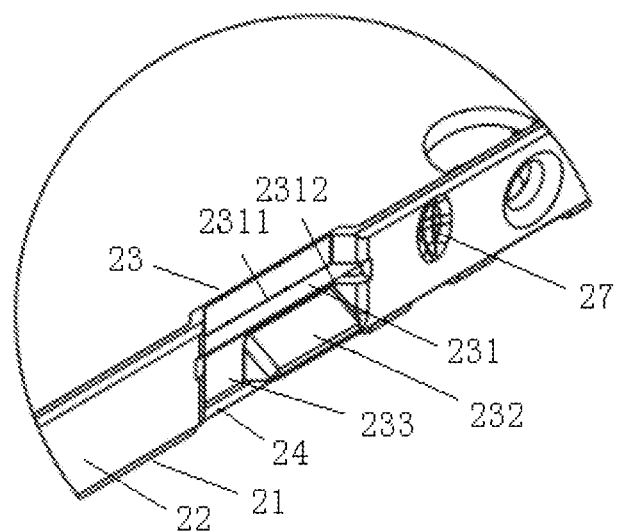
FIG. 3 is a perspective view of an inclination wall and a slot of the bottom housing according to the present invention.

FIG. 3, a partial enlargement of FIG. 2, illustrates an inclination wall 232 and a slot 233 of the bottom housing 2. The engagement slit 231 of the second sidewall 22 is defined by an upper edge 2311 and a lower edge 2312, which both are set on the second sidewall 22. As the upper and lower edges 2311, 2312 of the engagement slit 231 contains and clamps a border of the printed circuit board 3, the printed circuit board 3 mates to the engagement slit 231. Therefore, it would prevent the printed circuit board 3 from the loose connection.

The inclination wall 232, referring in FIG. 3, extends from the lower edge 2312 of the engagement slit 231 and distancing from the accommodation. The inclination wall 232 reaches out downwardly and outwardly. The inclination wall 232 defines a beginning end and a distal end, and the beginning end is higher than the distal end thereof. The inclination wall 232 is functioned of a slope thereof for gliding and sliding.

The slot 233 sits just next to the inclination wall 232. The slot 233 is applicable with a lever member (not shown) for leverage function. In this case, the slot 233 is regarded as a fulcrum for the lever member, so that the lever member is capable of lifting up the top housing 1 to disengage the top housing 1 from the bottom housing 2.

With further reference in FIG. 2 and FIG. 3, there are four inclination walls 232 set below the four engagement slits 231 respectively, and there are four slots 233 adjacent to the inclination wall 232 respectively.

Referring to FIG. 1, the first sidewall 12 includes a fringe protrusion 13 disposed on an interior face thereof. The fringe protrusion 13 approaches towards the accommodation and corresponds with the inclination wall 232 of the bottom housing 2. In the present embodiment, there are four fringe protrusions 13, distributed on the interior face the first sidewall 12, respectively relating to the inclination walls 232 of the bottom housing 2. With reference FIG. 1 and FIG. 2, the four fringe protrusions 13 respectively glides along the four inclination walls 232 until each fringe protrusion 13 passes over the distal end of each inclination wall 232 for engagement thereto. The quantity and arrangement of the fringe protrusion 13 obviously is free from description of the present embodiment, and one criteria is to match the allocation of the inclination walls 232.

When the top housing 1 covers/engages with the bottom housing 2 to come into the casing, the slot 233 exposes wholly or partially. The exposed part of the slot 233 allows the lever member to abut onto and against, thereby the lever member would lift up the top housing 1 disengaging from the bottom housing 2.

According to the embodiment of the present invention, the bottom housing 2 is provided with the inclination wall 232, and the top housing 1 is provided with the fringe protrusion 13, which corresponds to the inclination wall 232 of the bottom housing 2. In assembly, the inclination wall 232 of the bottom housing 2 guides the fringe protrusion 13 of the top housing 1 to move along the slop per se, until the fringe protrusion 13 get over the distal end of the inclination wall 232 so as to engage with the distal end of the inclination wall 232. It makes the engagement more easily and conveniently. In the meanwhile, the bottom housing 2 is provided with the slot 233, which allows the lever member to reach for leveraging and further disengaging the top and the bottom housings 1, 2 apart.

Further description according to the present invention, the second sidewall 22 defines a concave portion 23 against the accommodation, and the inclination wall 232 is disposed at the concave portion 23.

For further description of the present embodiment, four concave portions 23 distributed on the sidewalls 22; however, obviously, the quantity and arrangement of the concave portion 23 is free from description of the embodiment. The four concave portions 23 are distributed along the lateral parts of the second sidewall 22, and each is disposed at a mid-upper section on the second sidewall 22; wherein the lateral parts of the second sidewall 22 sets along the longitudinal length of the bottom plate 21. The quantity and arrangement of the engagement slit 231 is free from description of the embodiment. The concave portion 23 is formed with the engagement slit 231 and the inclination wall 232. The distal end of the inclination wall 232 exceeds the conjunction between the bottom plate 21 and the second sidewall 22.

For further description of the present embodiment, the slot 233 sits to overlap with the concave portion 23. The size of the slot 233 is not limited and one criteria is to allow the lever member to insert into.

For further description of the present embodiment, below each of the four inclination wall 232, at the conjunction between the bottom plate 21 and the second sidewall 22, an indentation 24 is further defined on the bottom housing 2. Referring to FIG. 3, the indentation 24 is configured to be fit with the fringe protrusion 13 of the top housing 1. A top of the indentation 24 overlies the distal edge of the inclination wall 232. The fringe protrusion 13 slides along the inclination wall 232 until it reaches the indentation 24, which is below the inclination wall 232, in order to engage with the distal end of the inclination wall 232, while the top housing 1 covers the bottom housing 2.

For clear interpretation, the quantity of the fringe protrusion 13, the concave portion 23, the engagement slit 231, the inclination wall 232 and the slot 233 is adjustable to meet requirements.

Figure 4:
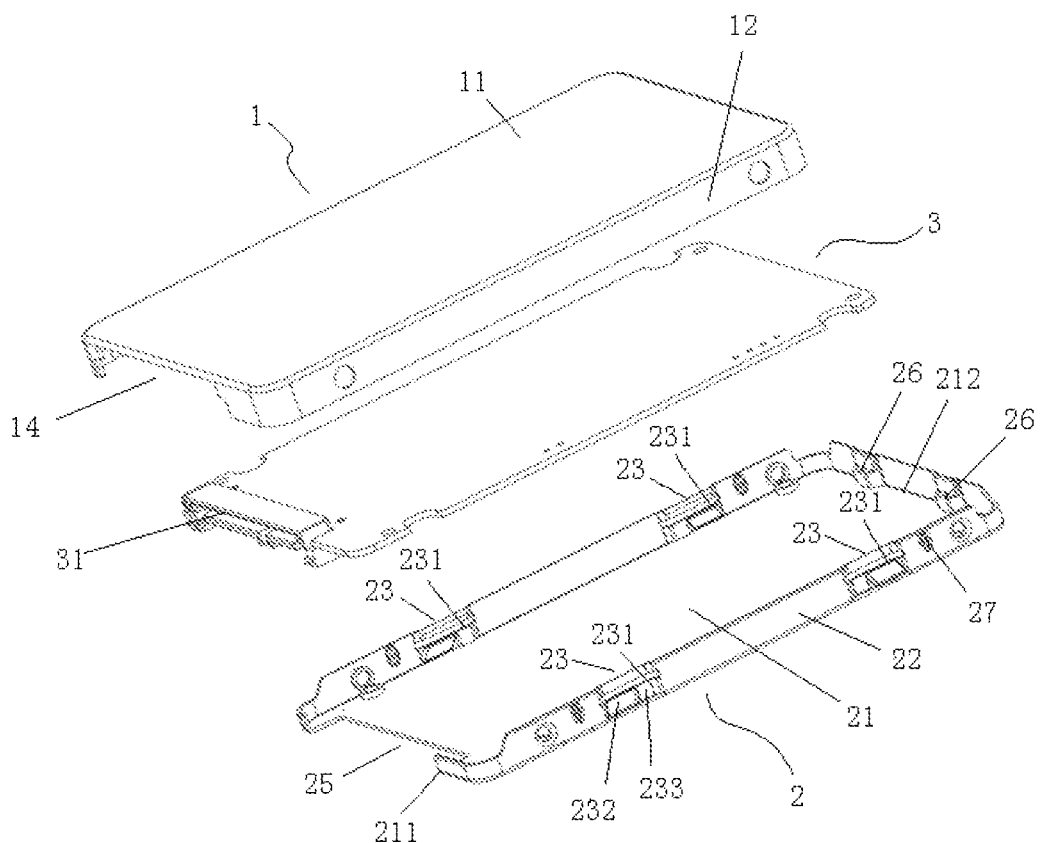
FIG. 4 is a decomposition view of a solid state drive according to the present invention.

Another embodiment according to the present invention, a solid state drive is provide, illustrated in FIG. 4. The solid state drive includes the housing assembly and the printed circuit board 3 mentioned above. The border of the printed circuit board 3 mates to the engagement slit 231 of the bottom housing 2 for being gripped by the upper and lower edges 2311, 2312 thereof, so that the printed circuit board 3 would be secured in the accommodation.

For further description of the present embodiment, with respect to FIG. 4, there are four concave portions 23 distributed along the lateral parts of the second sidewall 22, and each is disposed at an mid-upper section on the second sidewall 22; wherein the lateral parts of the second sidewall 22 sets along the longitudinal length of the bottom plate 21. Each of the concave portions 23 is formed with the engagement slit 231, the inclination wall 232 and the slot 233, and the border of the printed circuit board 3 insert the four engagement slits 231 for going mate with the bottom housing 2.

For further description of the present embodiment, the printed circuit board 3 includes an electrical connector 31 disposed at a front end thereof, for communication with the external devices.

For further description of the present embodiment, with respect to FIG. 4, the bottom plate 21 of the bottom housing 2 includes a receding portion 25 disposed at a first end 211 thereof. The top housing 1 has an opening 14 in correspondence with the receding portion 25 of the bottom plate 21.

Figure 5:
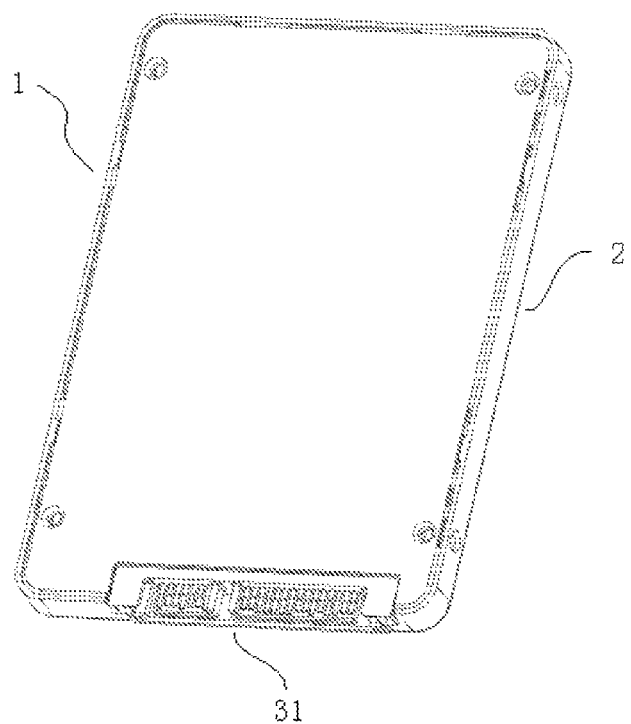
FIG. 5 is a perspective view of the solid state drive after accomplishing housing assembly according to the present invention.

The electrical connector 31, referring to FIG. 5, is capable of exposing via the receding portion 25 while the top housing 1 covers/engages with the bottom housing 2.

For further description of the present embodiment, the bottom plate 21 of the bottom housing 2 includes at least one support stage 26 disposed at a second end 212 thereof. The second end 212 of the bottom plate 21 is opposite to the first end 211 of the bottom plate 21. The support stage 26 projects towards the top housing 1 to prop the printed circuit board 3 for position in advance, before the printed circuit board 3 mates to the engagement slit 231.

For further description of the present embodiment, referring in FIG. 2 and FIG. 4, there are two support stages 26 at the conjunction between the second end 212 of the bottom plate 21 and the second sidewall 22. The support stages 26 are regarding as a supportive structure for propping and orientating the printed circuit board 3 in advance. The support stages 26 further improves the structure strength of the bottom housing 2 in order to diminish the possibility and amount of deformation of the printed circuit board 3, wherein the deformation is usually caused due to external impact.

For further description of the present embodiment, the second sidewall 22 includes at least one restraint projection 27 disposed at the interior face thereof, referring in FIG. 2. The restraint projection 27 abuts against lateral parts of the boarder of the printed circuit board 3 while the printed circuit board 3 mates to the engagement slit 231. Therefore, the restraint projection 27 constrains the displacement or vibration possibilities of the printed circuit board 3 in order to prevent the printed circuit board 3 from loose connection.

In assembly, the bottom housing 2 is reversed upside down, which allows the bottom plate 21 lie upon the table surface. At first, to implement a tail end, opposite to the front end, of the printed circuit board 3 to contact upon the support stages 26 of the bottom housing 2. To enforce the printed circuit board 3 to make the border of the printed circuit board 3 mate to the engagement slits 231 of the second sidewall 22, and the printed circuit board 3 thereby is installed in the bottom housing 2.

To flip over the bottom housing 2 with the printed circuit board 3 installed, and further to enforce the bottom housing 2 covering to the top housing 1, which is upside down, after alignment. The four fringe protrusions 13 of the first sidewall 12 of the top housing 1 slides along the four inclination walls 232 of the second sidewall 22 respectively, until each fringe protrusion 13 passes the distal end of the corresponding inclination wall 232, further reaches the corresponding indentation 24, and engages with the corresponding inclination wall 232. The assembly of the solid state drive is now accomplished. To flip over the accomplished solid state drive, the bottom housing 2 is up in a perspective view referring in FIG. 5.

In disassembly, to flip over the solid state drive to make the bottom plate 21 up, as illustrated in FIG. 5. To pick any lateral side of the bottom housing 2, and to implement the lever member inserting into the two slots 233 on the selected side of the bottom housing 2 for enforcing leverage in sequence. The top housing 1 is apart from the bottom housing 2 thereby. To further pick any lateral side of the bottom hosing 2, and to remove the printed circuit board 3 from the bottom housing 2, usually by the lever member as well. The lever member is inserted into gap between the printed circuit board 3 and the bottom housing 2 for further manipulating leverage operation. All elements are disengaged from one another.

Although the present invention has been described with respect to specific preferred embodiments thereof, it is in no way limited to the specifics of the illustrated structures but changes and modifications may be made within the scope of the appended claims.

What is claimed is:

1. A housing assembly comprising a top housing, a bottom housing, and an accommodation defined by the top housing covered with the bottom housing; the top housing having a top plate, and a first sidewall extending from a periphery of the top plate and approaching the bottom housing; the bottom housing having a bottom plate, and a second sidewall extending from a periphery of the bottom plate and approaching the top housing; the second sidewall having at least one engagement slit for being mated with a printed circuit board, which is received in the accommodation; wherein the engagement slit is defined by an upper edge and a lower edge;
the second sidewall includes an inclination wall extending from the lower edge of the engagement slit and distancing from the accommodation outwardly and downwardly, and a slot being adjacent to the inclination wall;
the first sidewall includes a fringe protrusion approaching the accommodation and corresponding with the inclination wall; whereby the fringe protrusion of the first sidewall keeps sliding along the inclination wall of the second sidewall so as to engage with a distal end of the inclination wall, while the top housing covers the bottom housing; and
the slot exposes wholly or partially, after the top housing engages with the bottom housing, and
wherein the bottom housing defines an indentation at a conjunction between the bottom plate and the second sidewall; the indentation corresponds to and sits below the inclination wall, and a top of the indentation overlies the distal edge of the inclination wall; whereby the fringe protrusion of the first sidewall keeps sliding along the inclination wall of the second sidewall so as to reach the indentation below the inclination wall, while the top housing covers the bottom housing.

2. The housing assembly as claimed in claim 1, wherein the second sidewall defines a concave portion against the accommodation, and the inclination wall is disposed at the concave portion.

3. The housing assembly as claimed in claim 2, wherein the slot sits to overlap with the concave portion.

4. The housing assembly as claimed in claim 3, wherein the slot is applicable with a lever member, so that the lever member is capable of disengaging the top housing from the bottom housing.

5. A solid state drive comprising the housing assembly and the printed circuit board claimed in claim 1, wherein the printed circuit board defines a boarder, which mates to the engagement slit of the bottom housing, so that the printed circuit board is secured in the accommodation.

6. The solid state drive as claimed in claim 5, wherein the printed circuit board includes an electrical connector disposed at a front end thereof.

7. The solid state drive as claimed in claim 6, wherein the bottom plate of the bottom housing includes a receding portion disposed at a first end thereof, the top housing has an opening in correspondence with the receding portion of the bottom plate; the electrical connector exposes via the receding portion as the top housing engages with the bottom housing.

8. The solid state drive as claimed in claim 7, wherein the bottom plate of the bottom housing includes at least one support stage disposed at a second end thereof, wherein the second end is opposite to the first end; the support stage projects towards the top housing so as to prop the printed circuit board for pre-position before the printed circuit board mates to the engagement slit.

9. The solid state drive as claimed in claim 8, wherein the second sidewall includes at least one restraint projection disposed at an interior face thereof, the restraint projection abuts against the boarder of the printed circuit board while the printed circuit board mates to the engagement slit.

* * * * *